United States Patent
Reuter

(10) Patent No.: US 10,886,150 B2
(45) Date of Patent: Jan. 5, 2021

(54) POSITIONING APPARATUS

(71) Applicant: Marco Systemanalyse und Entwicklung GmbH, Dachau (DE)

(72) Inventor: Martin Reuter, Dachau (DE)

(73) Assignee: Weber Machinenbau GmbH Breidenbach

( * ) Notice: Subject to any disclaimer, the term of this patent is extended or adjusted under 35 U.S.C. 154(b) by 138 days.

(21) Appl. No.: 16/136,976

(22) Filed: Sep. 20, 2018

(65) Prior Publication Data

US 2019/0115229 A1 Apr. 18, 2019

(30) Foreign Application Priority Data

Oct. 13, 2017 (DE) .................. 10 2017 009 542

(51) Int. Cl.
| | |
|---|---|
| *H01L 21/67* | (2006.01) |
| *B23Q 1/34* | (2006.01) |
| *H01L 41/08* | (2006.01) |
| *H01L 41/09* | (2006.01) |
| *B25J 15/00* | (2006.01) |
| *H02N 2/02* | (2006.01) |
| *F16M 13/00* | (2006.01) |
| *H02N 2/00* | (2006.01) |

(52) U.S. Cl.
CPC .......... *H01L 21/67011* (2013.01); *B23Q 1/34* (2013.01); *B25J 15/00* (2013.01); *H01L 41/0825* (2013.01); *H01L 41/09* (2013.01); *F16M 13/00* (2013.01); *H02N 2/0095* (2013.01); *H02N 2/021* (2013.01)

(58) Field of Classification Search
None
See application file for complete search history.

(56) References Cited

U.S. PATENT DOCUMENTS

| | | | |
|---|---|---|---|
| 4,570,168 A | 2/1986 | Sjordal et al. | |
| 2006/0138871 A1* | 6/2006 | Rakhovsky | ........ B23Q 17/2495 310/12.06 |
| 2011/0262622 A1* | 10/2011 | Herre | .................. B05C 11/1018 427/8 |
| 2013/0140949 A1* | 6/2013 | Urano | .................... H01L 41/042 310/317 |
| 2013/0328967 A1* | 12/2013 | Miyazawa | ............. H02N 2/103 347/37 |
| 2014/0352459 A1* | 12/2014 | Matsuzawa | .......... H02N 2/0075 73/865.8 |
| 2015/0127159 A1* | 5/2015 | Kamiya | .................. G01P 15/18 700/258 |

(Continued)

FOREIGN PATENT DOCUMENTS

| | | |
|---|---|---|
| DE | 9422389 U1 | 8/2001 |
| DE | 102007036472 B3 | 1/2009 |

(Continued)

*Primary Examiner* — Jethro M. Pence
(74) *Attorney, Agent, or Firm* — Dickinson Wright PLLC

(57) ABSTRACT

A positioning apparatus comprises a base element provided for fastening to a robot, a base movably supported at the base element, and a piezoactuator by which the base is movable in a direction relative to the base element. A second piezoactuator is provided by which a counterweight is simultaneously movable in an opposite direction.

13 Claims, 3 Drawing Sheets

(56) References Cited

U.S. PATENT DOCUMENTS

Figure 1:
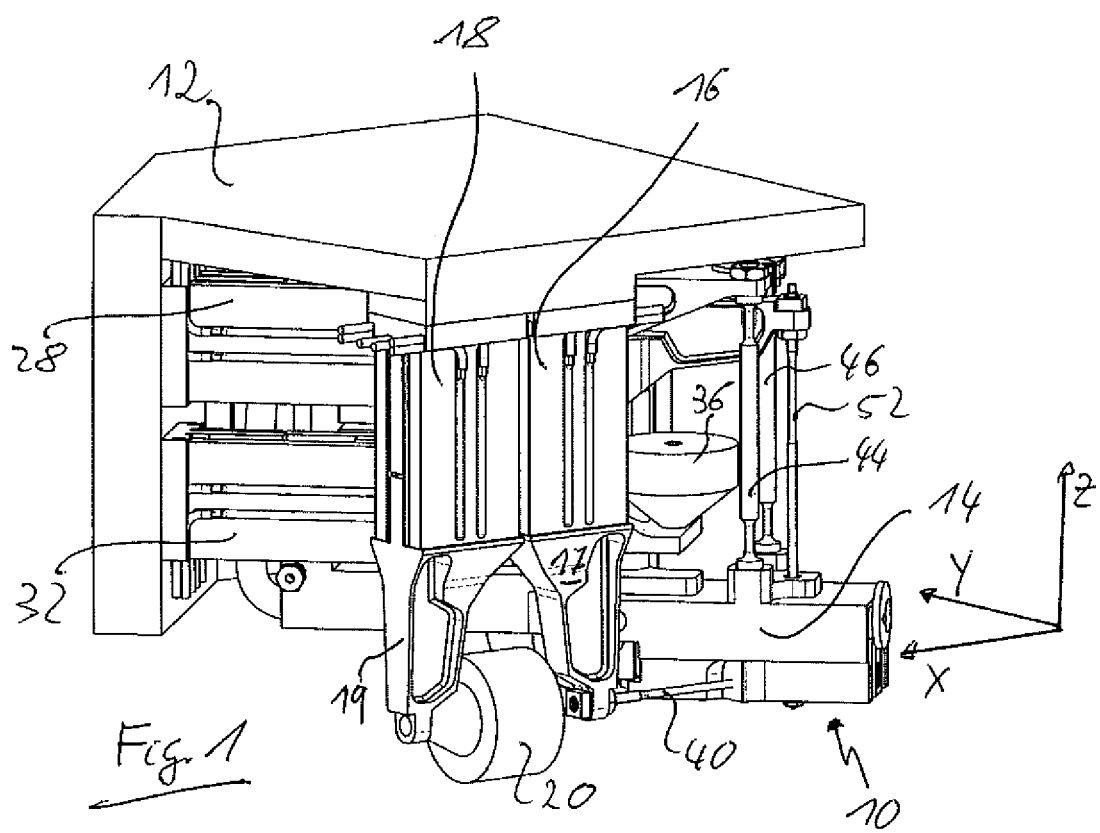

| | | | | |
|---|---|---|---|---|
| 2016/0049574 A1* | 2/2016 | Iwazaki | .................... | H02N 2/14 |
| | | | | 74/490.05 |
| 2018/0226561 A1* | 8/2018 | Iwazaki | ................. | H02N 2/103 |
| 2018/0323729 A1* | 11/2018 | Arakawa | ................ | B25J 9/0009 |
| 2019/0149066 A1* | 5/2019 | Arakawa | ................ | H02N 2/028 |
| | | | | 310/323.17 |

FOREIGN PATENT DOCUMENTS

| | | |
|---|---|---|
| DE | 202015104610 U1 | 12/2016 |
| DE | 102015216531 A1 | 3/2017 |
| JP | 61104857 A | 5/1986 |
| JP | H04132904 A | 5/1992 |
| JP | 2000221409 A | 8/2000 |
| JP | 2001264050 A | 9/2001 |
| JP | 2001266517 A | 9/2001 |
| JP | 2005014123 A | 1/2005 |
| JP | 2005312208 A | 11/2005 |
| JP | 2015134434 A | 7/2015 |
| JP | 2016172220 A | 9/2016 |

\* cited by examiner

POSITIONING APPARATUS

The present invention relates to a positioning device, in particular for a metering apparatus, fastenable to a robot.

Metering apparatus are generally known and are used, for example, in the semiconductor industry to apply defined quantities of a solder paste, in particular in the form of drops, onto a substrate to form solder points on the substrate. The attachment of the metering apparatus to a robot here enables a fully automatic implementation of a plurality of drop-shaped solder points within a predefined time period in that the robot travels the metering apparatus from one solder point to the next and stops for an exact placement of a drop. The masses of inertia that in particular occur on an accelerating and decelerating of the robot, that may lead to unwanted vibrations of the robot under certain circumstances, that can thereby impair an exact metering of the medium, and that at least limit the speed at which solder points can be placed have proven to be problematic in known metering apparatus.

Classical robots furthermore always have a problem when movements have to be carried out very fast and in changing directions or with a fast start/stop. The acceleration that changes in direction generates vibrations in the robot. Linear guides cannot be highly preloaded if they are to be smooth-running, which means that they do not provide any high resistance for a small movement.

It is the underlying object of the invention to provide a positioning apparatus that permit precise positions to be traveled to at high speeds.

The object is satisfied by an apparatus having the features of claim 1.

It is the underlying general idea of the invention on the use of the positioning apparatus for a metering valve, on the one hand, not to implement the movement of the metering valve required for the placement of a drop solely by the robot, but rather to additionally provide a piezoactuator for this purpose. The robot movement so-to-say therefore has a piezo movement superposed on it that can be controlled substantially faster and more exactly in comparison with the robot movement. The metering apparatus can in this manner, for example, be traveled at a constant speed over the substrate, but at least without having to be significantly decelerated and accelerated, while the actual placement of the drops is triggered by the piezoactuator. As a result, exactly metered drops, in particular drops having a diameter in the range from 100 µm to 200 µm such as drops of a solder paste, can hereby be applied to a substrate a very great deal faster and thus more economically.

On the other hand, the invention is based on the idea that no changing load arises at the robot if a second mass is moved as a counterweight at the metering head in the same axis, but in the opposite direction.

Advantageous embodiments of the invention can be seen from the dependent claims, from the description and from the drawing.

It can be advantageous if the drive for the counterweight is fastened to the same component as the drive of the base in this axis. The counterweight does not necessarily have to be moved in the same axis. A movement is also compensated when half the respective mass is moved in an opposite sense on a movement of the base to the right and to the left.

It can be advantageous to design the drives for the base and the drives for the compensation mass as identical; these two movements can then be carried out with opposite polarity by a control.

It is also advantageous if the base to be moved has a mass that is as small as possible.

In accordance with an embodiment, two different piezo movements are provided that span a plane within which the metering valve can be moved. The strokes of the piezoactuators can be in the range from 100 µm to 500 µm.

The first and second directions are here preferably at least approximately at right angles to one another. One of the first and second directions can even coincide with the direction of movement of the robot, i.e. one of the piezo movements coincides with the robot movement. The first direction can, for example, be vertically oriented and can in particular define a Z direction, while the second and third directions are horizontally oriented and in particular define an X direction and a Y direction in which the robot can also move.

If a horizontal robot movement has a first piezo movement in the same direction and a second piezo movement in the vertical direction superposed on it, it is possible to describe a cycloid with the metering valve and in particular with a metering needle of the metering valve, said cycloid being particularly well suited for placing drops on a substrate.

In accordance with a further embodiment, a plunger of a metering valve can be actuated by means of a piezoactuator. Due to the use of a piezo drive for the metering valve, its advantages of a fast and exact control also come into effect in the operation of the metering valve itself, i.e. in the actual metering. A direction of action of the third piezoactuator can here coincide with a direction of action of a piezoactuator for moving the metering valve and can, for example, be vertically oriented.

At least one sensor is advantageously provided for detecting the deflection of the at least one piezoactuator. A check can accordingly be made by such a sensor whether a desired deflection of the piezoactuator has actually been achieved by application of a voltage thereto and the voltage can optionally be suitably adapted. In other words, the sensor enables a regulation of the piezoactuator. A corresponding sensor is preferably associated with each piezoactuator. In general, however, only one of the piezoactuators or a selection of piezoactuators can also be monitored with a respective one sensor.

The or each piezoactuator can comprise a piezo element, that deforms, in particular distorts, on application of an electrical voltage, and an arm extension attached to the piezo element. The stroke of the piezoactuator can be increased by the piezoactuator.

A further subject of the invention is a metering system comprising a robot and a positioning apparatus of the above described kind fastened thereto. The above-explained advantages can be correspondingly achieved by means of the metering system.

The invention further relates to a method of metering a medium by means of a metering system that comprises a robot and a metering valve movably supported at the robot having the positioning apparatus, wherein the metering valve is traveled in a first direction by the robot and is simultaneously moved relative to the robot in the first direction by means of at least one first piezoactuator and in a second direction substantially perpendicular to the first direction by means of at least one second piezoactuator so that a metering needle of the metering valve describes a cycloid in a plane spanned by the first and second directions. Exactly metered drops, of a solder paste for example, in particular drops having a diameter in the range of 100 µm to 200 µm, can be applied particularly fast and economically using this method.

Figure 2:
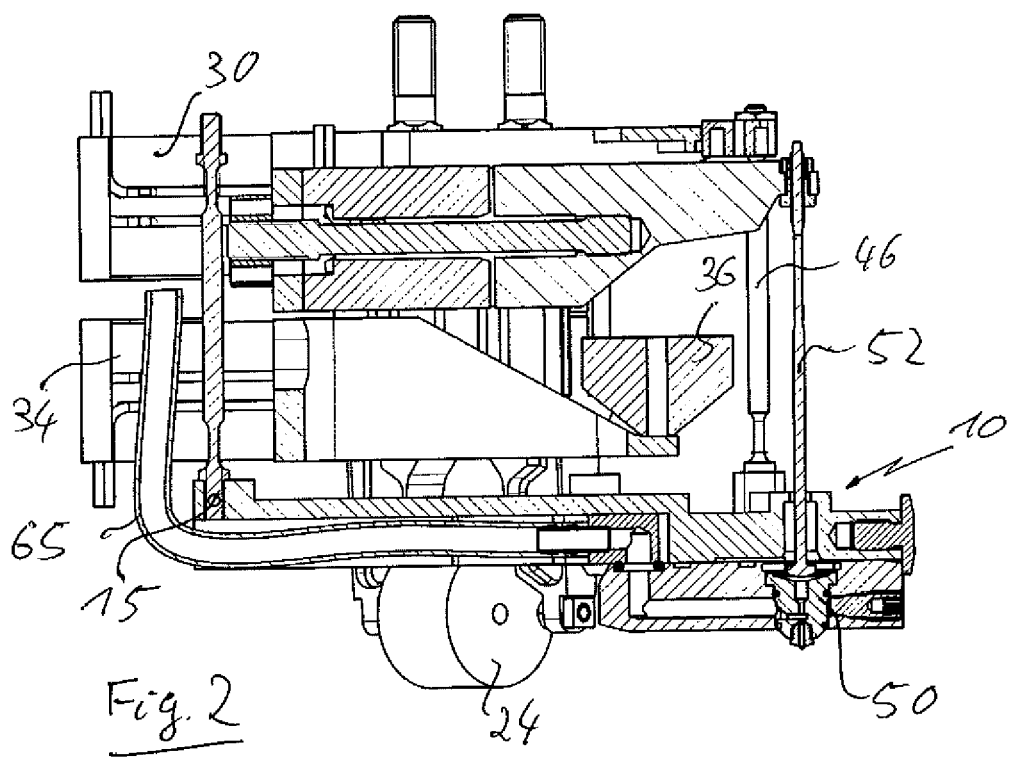
Figure 3:
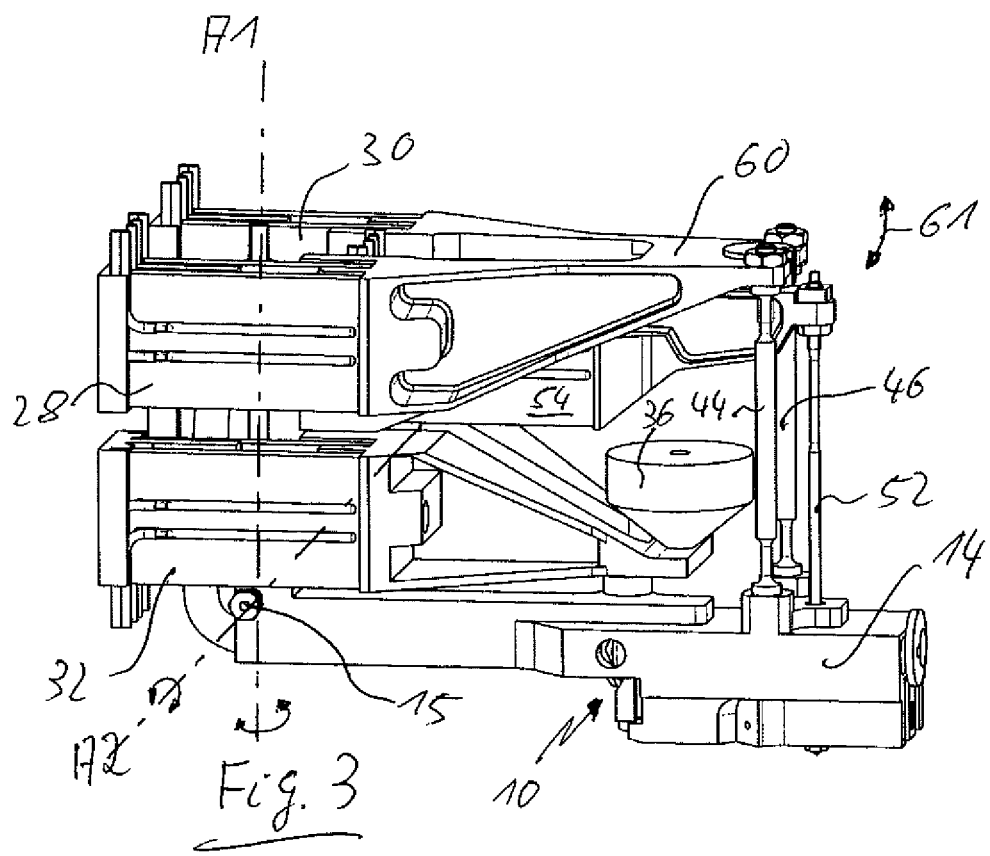
Figure 4:
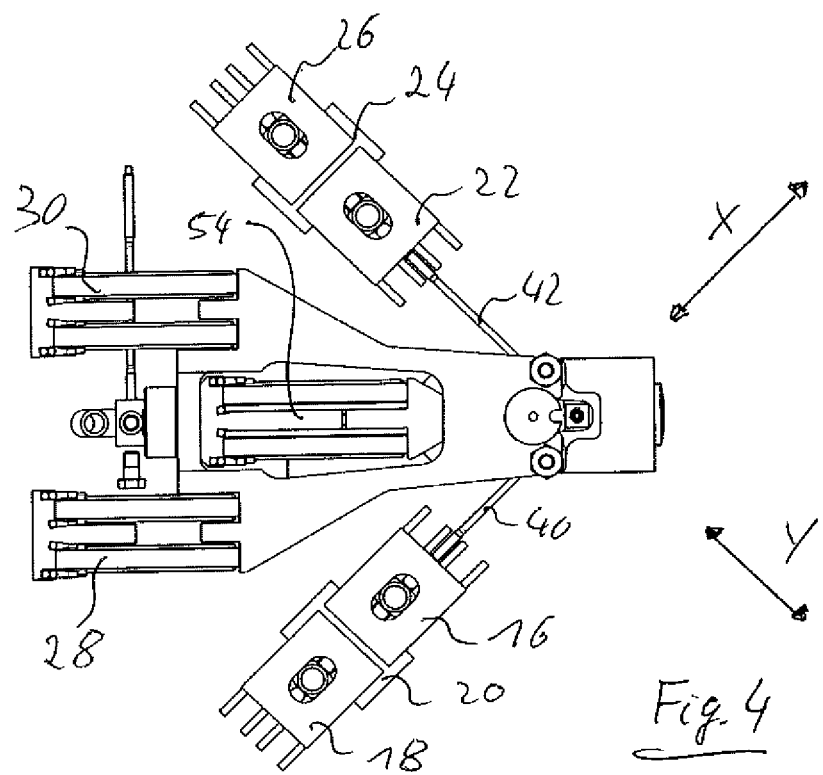
Figure 5:
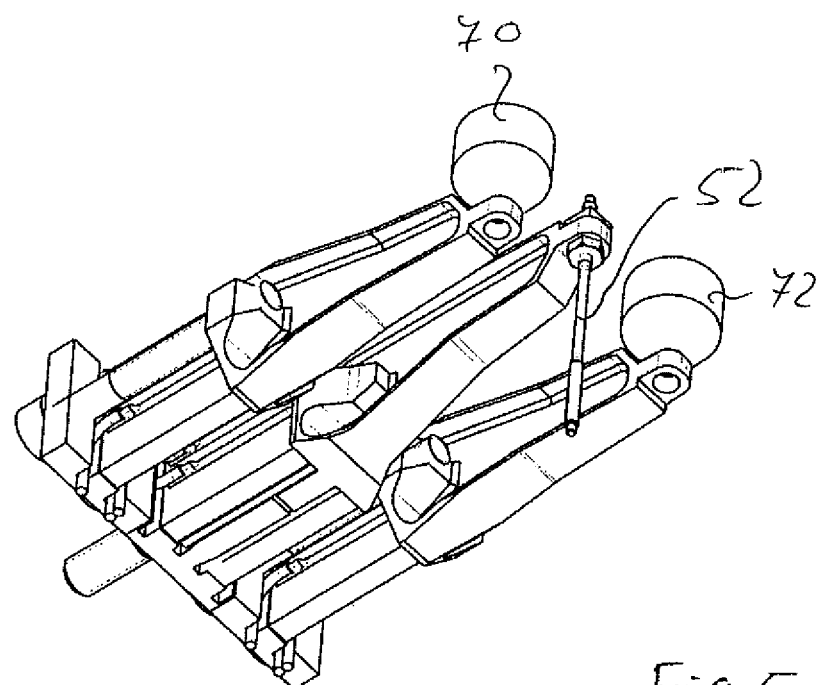

The invention will be described in the following purely by way of example with reference to an advantageous embodiment and to the enclosed drawing. There are shown:

FIG. 1 a perspective view of a positioning apparatus in accordance with the invention;

FIG. 2 a section through the positioning apparatus of FIG. 1;

FIG. 3 a detail of the view of FIG. 1;

FIG. 4 a detailed view of a metering valve of the metering apparatus of FIG. 1; and FIG. 5 a further embodiment of a counterweight.

FIGS. 1 to 4 show an apparatus for positioning a tool. A metering apparatus 10 for placing drops of a medium to be metered, a solder paste here, on a substrate is shown as an example for a tool in the Figures. Other tools can, however, also be considered, for example optical or electrical test apparatus or the like.

The positioning apparatus comprises a base element 12 provided for fastening to a robot, not shown, and a base 14 fastened to the base element 12. In the embodiment shown, the base 14 is formed as a metering apparatus 10.

The base 14 is movable and is in particular pivotable in a first direction X, in a second direction Y, and in a third direction Z relative to the base element 12. For this purpose, the base 14 is gimballed at an articulation point 15 such that the base 14 can be pivoted both about the axis A1 and about the axis A2 (FIG. 3).

A piezoactuator 16 is provided for a movement of the base 14 in the X direction and is connected to the base 14 via an arm extension 17 by means of a connecting rod 40. The lower end of the boom 17 is moved to and fro in the X direction by actuating the piezoactuator 16 so that the front end of the base 14 is interlocked about the axis A2. It must be noted here that the stroke of the piezoactuator 16 is in an order of magnitude of approximately 200 μm, i.e. the deflections are very small. Due to the large lever arm between the articulated point 15 and the front end of the base 14, the front end of the base 14 moves in an almost linear manner in the region of the actual deflections.

To compensate the movement of the base 14 by the piezoactuator 16, a further piezoactuator 18 is fastened to the base element 12 and likewise has an arm extension 19 to whose lower end a counterweight 20 is fastened. The two piezoactuators 18 are connected in opposite polarity to one and the same control output of a control, not shown, so that on a movement of the connecting rod 40 in the X direction, the counterweight 20 performs the same movement in the −X direction. No changing load is hereby produced at the robot if the base 14 with the metering device is frequently alternately moved to and fro.

As FIG. 4 shows, a piezoactuator 22 and a connecting rod 42 are provided for the movement of the base 14 in the Y direction, with a piezoactuator 26 at which a counterweight 24 is fastened being provided to compensate the movement. The design is the same as the one described above.

To be able to move the base 14 in the Z direction, it is connected via two connecting rods 44 and 46 to an arm extension 60 that can in turn be moved by two piezoactuators 28 and 30 in the direction of the double arrow 61 shown (FIG. 3), whereby the base 14 is pivotable about the axis A2. To compensate this movement, a third counterweight 36 is provided at the base element 12 and is pivotable via two piezoactuators 32 and 34 in the opposite sense to the movement of the piezoactuators 28 and 30. Since the respective piezoactuator for the movement of the base 14 and the piezoactuator for the counter-movement of the counterweight are of the same construction and are controlled with mirror symmetry, a best possible compensation of the movement is achieved.

As FIG. 2 illustrates, the base 14 is formed as a metering device and a metering valve 50 that can be opened and closed by the plunger 52 is located in the base 14. A hose 65 is provided to supply the medium to be metered.

FIG. 5 shows an alternative embodiment for the drive of the plunger 52, with not one counterweight being provided in this embodiment, but rather two counterweights 70 and 72 that can be moved symmetrically with respect to both sides of the plunger 52.

The base 14 is moved via the four connecting rods 40-46 with the connecting rods 44 and 46 performing a parallel movement in the Z direction and with the drives 16 and 22 in X and Y respectively pushing the position of the nozzle of the valve in this direction.

The design is configured such that the movement of the front end of the base 14 in X, Y, and Z is respectively produced by a slight rotation about a remote fixed point 15. Only a portion of the mass of the base has to be moved for the movement of the valve in X, Y, and Z due to this design. The fixed point 15 additionally makes it possible that the supply hose 65 for the valve 50 can here be conducted to a cartridge with a very small deformation by the movement.

It is advantageous to separate the drive and the tool and to transmit the movement by connection rods. It is also advantageous to produce the movement in X, Y, and Z by a slight rotational movement. If the tool or the base 14 is then designed as elongate so that the center of mass is remote from the location of the positioning (metering nozzle), only a little work in turn has to be carried out for the movement. The drives of the individual axes and the drives of the counterweights are respectively exactly the same. The control can then take place in a very simple manner in that the two drives are connected to the same control output with opposite polarity.

The invention claimed is:

1. An apparatus for positioning a tool, the apparatus comprising:
    a base element provided for fastening to a robot;
    a base movably supported at the base element;
    at least one first piezoactuator by which the base is movable in a first direction relative to the base element;
    at least one second piezoactuator by which a first counterweight is simultaneously movable in the direction oppositely disposed to the first directions;
    at least one third piezoactuator by which the base is movable in a second direction relative to the base element;
    at least one fourth piezoactuator by which a second counterweight is simultaneously movable in a direction opposite to the second direction;
    at least one fifth piezoactuator by which the base is movable in a third direction relative to the base element; and
    at least one sixth piezoactuator by which a third counterweight is simultaneously movable in a direction opposite to the third direction.

2. The apparatus in accordance with claim 1, wherein the tool is a metering apparatus.

3. The apparatus in accordance with claim 1, wherein all three directions extend at right angles to one another.

4. The apparatus in accordance with claim 1, wherein the base is pivotably arranged at the base body.

5. The apparatus in accordance with claim 4, wherein the base is pivotable about two axes that are perpendicular to one another.

6. The apparatus in accordance with claim 1, wherein at least two piezoactuators are fastened to the base element.

7. The apparatus in accordance with claim 6, wherein all the piezoactuators are fastened to the base element.

8. The apparatus in accordance with claim 1, wherein the movement of at least one piezoactuator is transmitted to the base via a connecting rod.

9. The apparatus in accordance with claim 1, wherein at least two piezoactuators are of the same construction.

10. The apparatus in accordance with claim 1, wherein at least two piezoactuators are connected in opposite polarities to one and the same control output of a control.

11. The apparatus in accordance with claim 1, wherein at least two counterweights have masses of different amounts.

12. The apparatus in accordance with claim 1, wherein the base has a metering valve that is actuated by a plunger that is movable by a metering drive.

13. The metering apparatus in accordance with claim 12, wherein the metering drive is movable in a direction together with the base.

* * * * *